(12) United States Patent
Lee et al.

(10) Patent No.: US 9,425,198 B2
(45) Date of Patent: Aug. 23, 2016

(54) SEMICONDUCTOR DEVICE HAVING STRAIN-RELAXED BUFFER LAYER AND METHOD OF MANUFACTURING THE SAME

(71) Applicants: Dong-Kyu Lee, Suwon-si (KR); Jae-Hwan Lee, Suwon-si (KR); Tae-Yong Kwon, Suwon-si (KR); Sang-Su Kim, Yongin-si (KR); Jung-Dal Choi, Hwaseong-si (KR)

(72) Inventors: Dong-Kyu Lee, Suwon-si (KR); Jae-Hwan Lee, Suwon-si (KR); Tae-Yong Kwon, Suwon-si (KR); Sang-Su Kim, Yongin-si (KR); Jung-Dal Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/289,672

(22) Filed: May 29, 2014

(65) Prior Publication Data

US 2014/0361378 A1    Dec. 11, 2014

(30) Foreign Application Priority Data

Jun. 7, 2013    (KR) .................. 10-2013-0065419

(51) Int. Cl.
*H01L 27/092* (2006.01)
*H01L 21/8238* (2006.01)
*H01L 21/8252* (2006.01)
*H01L 21/8258* (2006.01)
*H01L 27/06* (2006.01)

(52) U.S. Cl.
CPC ....... *H01L 27/0928* (2013.01); *H01L 21/8252* (2013.01); *H01L 21/8258* (2013.01); *H01L 21/823807* (2013.01); *H01L 27/0605* (2013.01)

(58) Field of Classification Search
CPC .................. H01L 27/0928; H01L 21/823807; H01L 27/0605; H01L 21/8258; H01L 21/8252
See application file for complete search history.

(56) References Cited

U.S. PATENT DOCUMENTS

| 5,442,205 | A | 8/1995 | Brasen et al. |
| 6,339,232 | B1 | 1/2002 | Takagi |
| 6,682,965 | B1 * | 1/2004 | Noguchi et al. ............... 438/199 |
| 7,071,014 | B2 | 7/2006 | Currie et al. |
| 7,303,949 | B2 | 12/2007 | Chen et al. |
| 7,525,161 | B2 | 4/2009 | Ieong et al. |

(Continued)

FOREIGN PATENT DOCUMENTS

| EP | 1644980 B1 | 3/2011 |
| JP | 2004-538639 | 12/2004 |

OTHER PUBLICATIONS

M. L. Lee and E. A. Fitsgerald, "Strained Si, SiGe, and Ge channels for high-mobility metal-oxide-semiconductor field-effect transistors," J. Appl. Phys. 97, 101101 (2005).

(Continued)

*Primary Examiner* — Jarrett Stark
*Assistant Examiner* — Bitew Dinke
(74) *Attorney, Agent, or Firm* — Volentine & Whitt, PLLC (57) ABSTRACT

A semiconductor device includes a substrate, a strain-relaxed buffer layer on the substrate, at least one well in the strain-relaxed buffer layer, a first channel layer on the strain-relaxed buffer layer, and a second channel layer on the well. A lattice constant of material constituting the first well is less than a lattice constant of the material constituting the strain-relaxed buffer layer, but a lattice constant of material constituting the second well is greater than the lattice constant of the material constituting the strain-relaxed buffer layer.

17 Claims, 11 Drawing Sheets

(56) References Cited

U.S. PATENT DOCUMENTS

| | | |
|---|---|---|
| 7,586,153 B2 | 9/2009 | Hoentschel et al. |
| 7,662,689 B2 | 2/2010 | Boyanov et al. |
| 7,728,387 B1* | 6/2010 | Krishnamohan et al. .... 257/369 |
| 7,741,167 B2 | 6/2010 | Beyer et al. |
| 7,777,250 B2 | 8/2010 | Lochtefeld |
| 2004/0135138 A1* | 7/2004 | Hsu et al. ........................ 257/19 |
| 2005/0133819 A1* | 6/2005 | Kawasaki ....... H01L 21/823807 257/195 |
| 2005/0136584 A1* | 6/2005 | Boyanov et al. ............. 438/199 |
| 2006/0068557 A1* | 3/2006 | Ochimizu et al. ............ 438/312 |
| 2006/0081836 A1* | 4/2006 | Kimura et al. ................. 257/19 |
| 2006/0094193 A1 | 5/2006 | Horstmann et al. |
| 2006/0289916 A1* | 12/2006 | Park et al. ..................... 257/296 |
| 2007/0164364 A1* | 7/2007 | Kawasaki ....... H01L 21/823425 257/368 |
| 2007/0298561 A1* | 12/2007 | Jumpertz et al. ............. 438/202 |
| 2008/0079084 A1* | 4/2008 | Hanafi .......................... 257/369 |
| 2009/0095981 A1* | 4/2009 | Kang et al. ................... 257/190 |
| 2010/0078682 A1* | 4/2010 | Ngai et al. .................... 257/192 |
| 2010/0219475 A1 | 9/2010 | Kronholz et al. |
| 2013/0045579 A1* | 2/2013 | Chien ............... H01L 21/76283 438/285 |
| 2013/0299895 A1* | 11/2013 | Oxland ................ H01L 21/225 257/329 |
| 2014/0008730 A1* | 1/2014 | Mitard et al. ................. 257/369 |

OTHER PUBLICATIONS

M. V. Fischetti, "On the enhanced electron mobility in strained-silicon inversion layers," J. Appl. Phys. 92, 7320 (2002).

* cited by examiner

SEMICONDUCTOR DEVICE HAVING STRAIN-RELAXED BUFFER LAYER AND METHOD OF MANUFACTURING THE SAME

PRIORITY STATEMENT

This U.S. non-provisional patent application claims priority under 35 U.S.C. §119 to Korean Patent Application No. 10-2013-0065419, filed on Jun. 7, 2013, in the Korean Intellectual Property Office (KIPO), the contents of which are hereby incorporated by reference in their entirety.

BACKGROUND

1. Field

The inventive concept relates to a semiconductor device and to a method of manufacturing the same. More particularly, the inventive concept relates to a semiconductor device comprising a transistor having a channel region in which a stress has been induced and to a method of manufacturing the same.

2. Description of the Related Art

The width and length of a channel of a MOS transistor are becoming smaller (for both NMOS and PMOS transistors) in response to the growing demands for smaller semiconductor devices. However, it is well known that a reduction in the length of the channel of a MOS transistor increases the likelihood that the device will exhibit certain defective performance characteristics known as short-channel effects.

Improved transistor structures, such as an RCAT (Recess Channel Array Transistor) or a SRCAT (Sphere-shaped Recess Channel Array Transistor), have allowed for greater channel lengths without compromising an overall reduction in size of the transistor. Thus, semiconductor devices may employ an RCAT or SRCAT to prevent short-channel effects, i.e., to ensure a high degree of performance. Regardless, the performance of a MOS transistor is generally compromised if the width of the channel of the MOS transistor is reduced because narrower channels reduce the amount of current flowing through the channel. Ultimately, the scaling down of the MOS transistor will worsen the reliability of the semiconductor device.

With these considerations in mind, instead of looking at ways to further reduce the physical dimensions of the channel, some research in the field has been aimed at increasing the mobility of charge carriers (electrons in the NMOS transistor or holes in the PMOS transistor) by applying a tensile stress or a compressive stress to the channel.

SUMMARY

In accordance with one aspect of the inventive concept, there is provided a semiconductor device including a substrate, a strain-relaxed buffer layer on the substrate, a first well in the strain-relaxed buffer layer and located in a first region of the device, a second well in the strain-relaxed buffer layer and located in a second region of the device, a first channel layer on the first well, and a second channel layer on the second well, and in which a lattice constant of material constituting the first channel layer is less than a lattice constant of material constituting the strain-relaxed buffer layer, and a lattice constant of material constituting the second channel layer is greater than said lattice constant of the material constituting the strain-relaxed buffer layer.

In accordance with another aspect of the inventive concept, there is provided a semiconductor device including a substrate, a strain-relaxed buffer layer having a p-type impurity on the substrate, a first channel layer on the strain-relaxed buffer layer and located in a first region of the device, an n-type well in the strain-relaxed buffer layer and located in a second region of the device, a second channel layer on the n-type well, and a gate dielectric disposed directly on the first and second channel layers, and in which a lattice constant of material constituting the first channel layer is less than a lattice constant of material constituting the strain-relaxed buffer layer, but a lattice constant of material constituting the second channel layer is greater than said lattice constant of material constituting the strain-relaxed buffer layer.

In accordance with still another aspect of the inventive concept, there is provided a semiconductor device including a substrate, a strain-relaxed buffer layer on the substrate, an NMOS transistor having a tensile-stressed channel region on the strain-relaxed buffer layer, and a PMOS transistor having a tensile stressed channel region on the strain-relaxed buffer layer. A first channel layer is disposed on the strain-relaxed buffer layer and extends in a lengthwise direction between the source and drain of the NMOS transistor. A gate electrode of the NMOS transistor is disposed on the first channel layer. A second channel layer is disposed on the strain-relaxed buffer layer and extends in a lengthwise direction between the source and drain of the PMOS transistor. A gate electrode of the PMOS transistor is disposed on the first channel layer. A lattice constant of material constituting the first channel layer is less than a lattice constant of material constituting the strain-relaxed buffer layer. A lattice constant of material constituting the second channel layer is greater than the lattice constant of the material constituting the strain-relaxed buffer layer.

In accordance with another aspect of the inventive concept, there is provided a method of manufacturing a semiconductor device, which includes forming a strain-relaxed buffer layer on a substrate, forming a first well in the strain-relaxed buffer layer in a first region, forming a second well in the strain-relaxed buffer layer in a second region, forming a first channel layer simultaneously on the first well and the second well and wherein the first channel layer is formed of a material having a lattice constant less than that of a lattice constant of material constituting the strain-relaxed buffer layer, forming a first mask that covers the first channel layer on the first well and exposes the first channel layer on the second well, removing the first channel layer from over the second well, forming a second channel layer on the second well and wherein the second channel layer is formed of a material having a lattice constant greater than that of material constituting the strain-relaxed buffer layer, and removing the first mask.

In accordance with another aspect of the inventive concept, there is provided a method of manufacturing a semiconductor device, which includes providing a substrate, forming a strain-relaxed buffer layer on the substrate, forming an n-type well in the strain-relaxed buffer layer, forming a first channel layer on the strain-relaxed buffer layer in a first region and wherein the first channel layer is formed of a material having a lattice constant less than that of a lattice constant of material constituting the strain-relaxed buffer layer, forming a second channel layer on the n-type well in a second region and wherein the second channel layer is formed of a material having a lattice constant greater than that of material constituting the strain-relaxed buffer layer, and forming a gate dielectric layer directly on the first and second channel layers.

BRIEF DESCRIPTION OF THE DRAWINGS

The foregoing and other features and advantages of the inventive concept will be apparent from the more detailed description of preferred embodiments, as illustrated in the accompanying drawings. The drawings are not necessarily to scale, emphasis instead being placed upon illustrating the principles of the inventive concept.

FIGS. 18 through 33 illustrate another embodiment of a method of manufacturing a semiconductor device according to f the inventive concept, wherein each of FIGS. 18, 19, 20, 21, 22, 23, 24, 25, 26, 27, 28, 29, 30, 31 and 32 is a cross-sectional view of the device during the course of its manufacture

DETAILED DESCRIPTION OF THE PREFERRED EMBODIMENTS

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "top" or "bottom" as used to describe a surface generally refer not only to the orientation depicted in the drawings but to the fact that the surface is the uppermost or bottommost surface in the orientation depicted, as would be clear from the drawings and context of the written description.

It will also be understood that when an element or layer is referred to as being "on" or "connected to" another element or layer, it can be directly on or directly connected to the other element or layer or an intervening element(s) or layer(s) may be present. In contrast, when an element or layer is referred to as being "directly on" or "directly connected to" another element or layer, there is no intervening element or layer present. Likewise, when an element is referred to as being "between" other elements, it can be in contact with the other elements or an intervening element(s) may be present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "strain-relaxed" as used to describe a layer will be understood as generally referring to the fact that the layer has no intrinsic stress, i.e., no internal stress as the result of the way in which it was produced. That is, the term "strain-relaxed" will be understood as meaning substantially stress free. Furthermore, a description of the inventive concept includes examples in which the crystal lattice of material constituting key layers has a cubic lattice structure and so, the term "a lattice constant" may be understood as referring to all of the constants of the units making up the crystal lattice.

A first embodiment of a method of manufacturing a semiconductor device according to the inventive concept will now be described in detail with reference to FIGS. 1 through 17.

Figure 1:
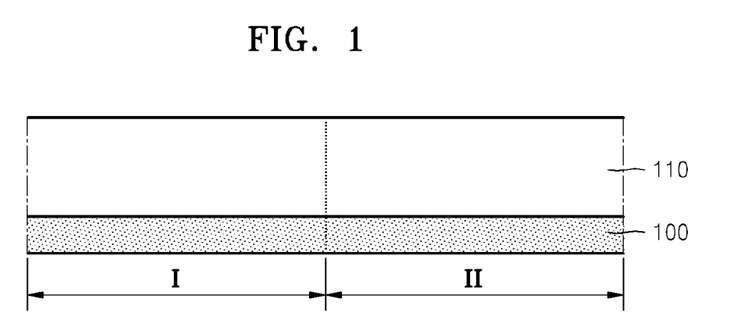
FIGS. 1 through 17 illustrate an embodiment of a method of manufacturing a semiconductor device according to the inventive concept, wherein each of FIGS. 1, 2, 3, 4, 5, 6, 7, 8, 9, 10, 11, 12, 13, 14, 15, 16 and 17 is a cross-sectional view of the device during the course of its manufacture.

Referring first to FIG. 1, a substrate 100 is provided. The substrate 100 may be a rigid substrate, e.g., a bulk silicon substrate, a silicon-on-insulator (SOI) substrate, a germanium substrate, a silicon germanium substrate, an indium antimonide substrate, a lead telluride substrate, an indium arsenide substrate, an indium phosphorus substrate, a gallium arsenide substrate, or an antimony gallium substrate.

A strain-relaxed buffer layer 110 is formed on the substrate 100. The strain-relaxed buffer layer 110 may comprise at least one material selected from the group consisting of compounds including a semiconductor from group 3, 4 or 5, silicon germanium (SiGe), and germanium (Ge). Compounds including a semiconductor from group 3, 4 or 5 include gallium arsenic antimonide (GaAsSb), indium gallium arsenide (InGaAs), indium antimonide (InSb), gallium antimonide (GaSb), and indium arsenide (InAs). The strain-relaxed buffer layer 110 may be formed by an epitaxial growth process which is not accompanied by any doping process (i.e., without doping the epitaxially grown material with n-type or p-type dopants). Such a process may be conducted in a temperature range of 450-1200° C. Also, the strain-relaxed buffer layer 110 is preferably formed to a thickness of 300 to 1000 nm.

Figure 2:
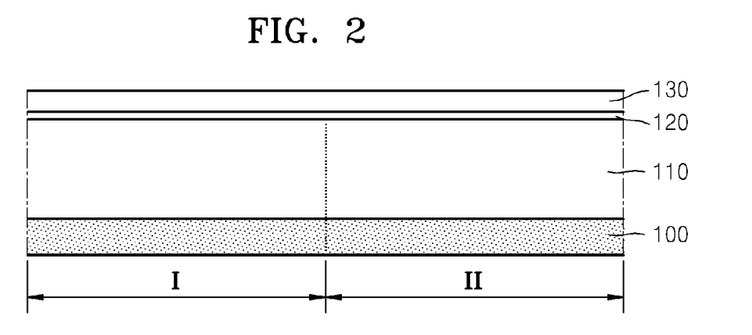

Referring to FIG. 2, a sacrificial layer 120 is formed on the strain-relaxed buffer layer 110. The sacrificial layer 120 may comprise a silicon oxide layer, having a thickness of 10 to 100 nm, formed by a thermal oxidation process or chemical vapor deposition (CVD) process.

Then a first mask layer(s) 130 is formed on the sacrificial layer 120. The first mask layer(s) 130 may comprise at least one layer of material selected from the group consisting of silicon nitride (SiN) and silicon oxynitride (SiON).

Figure 3:
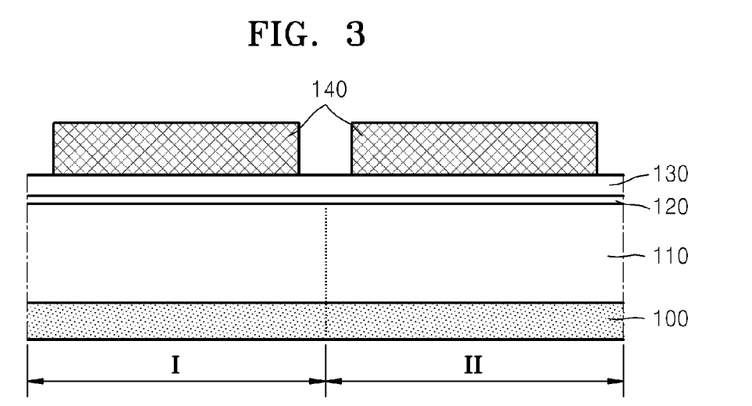

Referring to FIG. 3, a photoresist pattern 140 is formed on the first mask layer(s) 130. The photoresist pattern 140 exposes a portion of the upper surface of the first mask layer(s) 130 formed at a boundary between a first region I and a second region II of the device.

Figure 4:
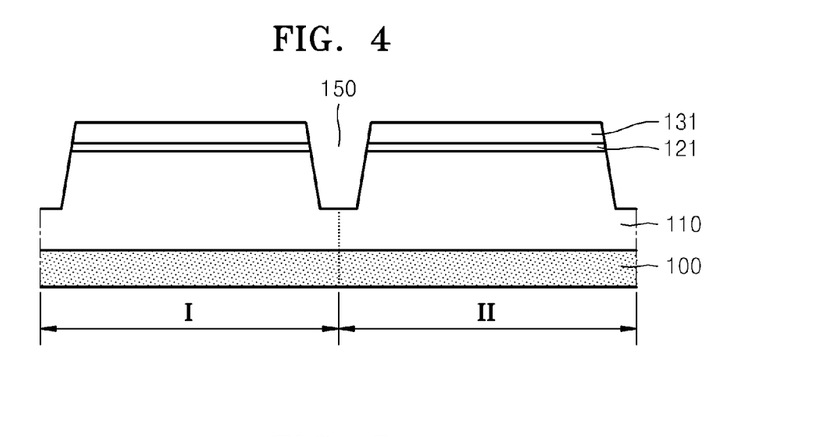

Referring to FIG. 4, a trench 150 is formed in the strain-relaxed buffer layer 110 at the boundary between the first region I and the second region II. In this embodiment, the trench 150 is formed by etching the first mask layer(s) 130, the sacrificial layer 120, and the strain-relaxed buffer layer 110. For example, a first mask 131 is formed by etching the first mask layer(s) 130 using the photoresist pattern 140 as an etching mask. The photoresist pattern 140 is then removed after the first mask 131 is formed, and the strain-relaxed buffer layer 110 is then etched using the first mask 131 as an etching mask. Alternatively, the photoresist pattern 140 is removed after the trench 150 is formed in the strain-relaxed buffer layer 110. In either of these cases, the sacrificial layer 120 is etched to form a sacrificial layer pattern 121.

Figure 5:
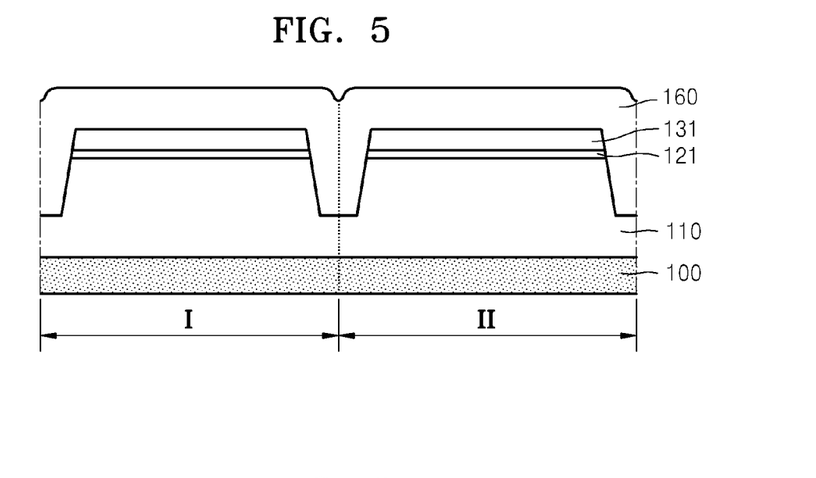

Referring to FIG. 5, a device isolation layer 160 is formed in the trench 150 and on the first mask 131. The device isolation layer 160 may comprise a silicon oxide layer formed by a high-density plasma (HDP) process or a flowable chemical vapor deposition (FCVD) process.

Figure 6:
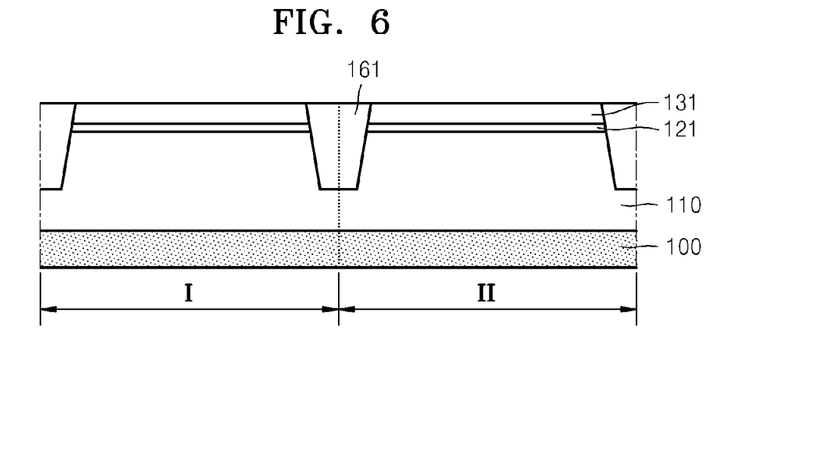

Referring to FIG. 6, a device isolation region 161 is formed at the boundary between the first region I and the second region II by planarizing the device isolation layer 160 until an upper surface of the first mask 131 is exposed. The planarizing of the device isolation layer 160 may be effected by an etch-back process or a chemical mechanical polishing (CMP) process. Also, at this time, the bottom surface of the device isolation region 161 may be disposed above the upper surface of the substrate 100.

Figure 7:
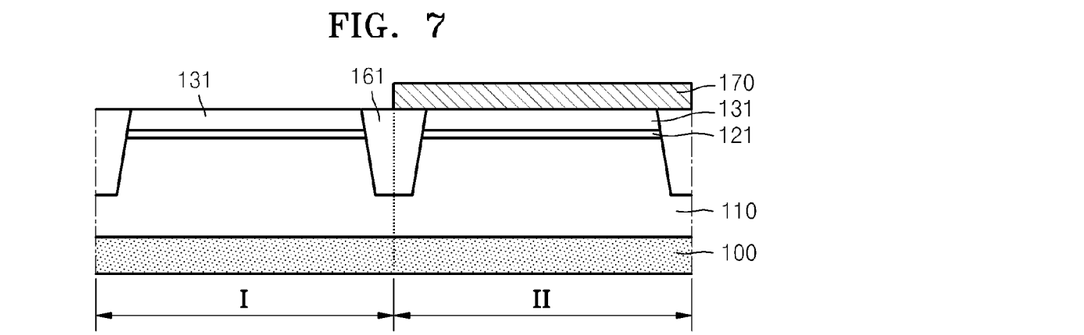

Referring to FIG. 7, a second mask 170 is formed to cover the first mask 131 in the second region II and expose the first mask 131 in the first region I. The second mask 170 may be a photoresist pattern, i.e., the second mask 170 may be formed by forming a layer of photoresist on the substrate 100 and then patterning the layer of photoresist.

Figure 8:
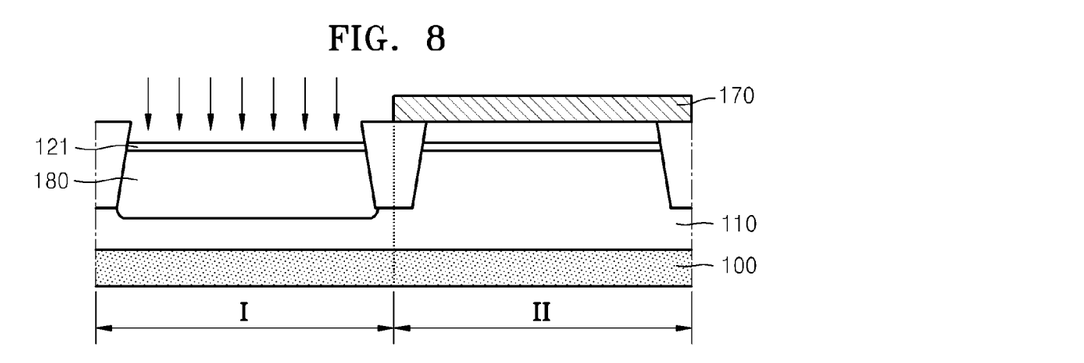

Referring to FIG. 8, the first mask 131 is removed from the first region I. Then a first well 180 is formed in the strain-relaxed buffer layer 110 in the first region I, using a first ion implantation process. The first ion implantation process may implant a p-type dopant, e.g., boron fluoride (BF2) or boron (B) into the strain-relaxed buffer layer 110. That is, the first well 180 may be a p-type well. The second mask pattern 170 may then be removed from the second region II. In addition, the device at this point in the process may be subjected to a first heat treatment which causes the implanted (p-type) dopant to diffuse in the strain-relaxed buffer layer 110 in the second region II. Accordingly, the first well 180 may be formed such that its lowermost boundary is disposed below the level of the bottom surface of the device isolation region 161.

Figure 9:
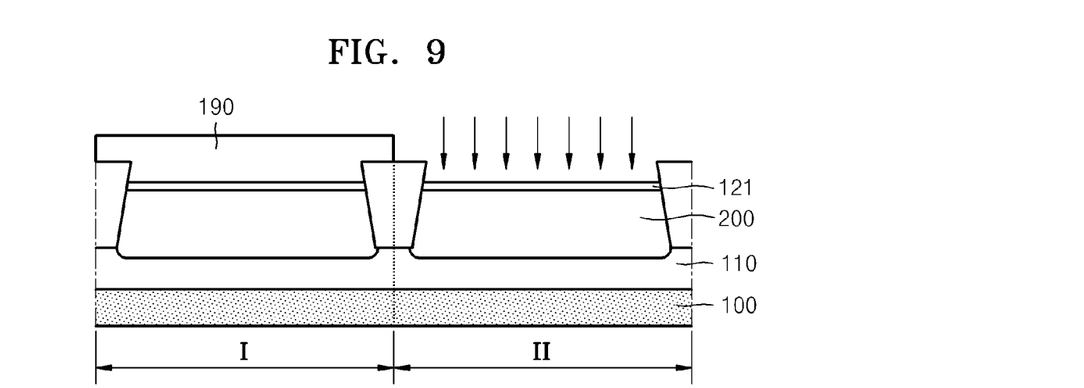

Referring to FIG. 9, after the second mask 170 has been removed from the second region II, a third mask 190 is formed to cover the sacrificial layer pattern 121 in the first region I. The third mask 190 is preferably of material having a good etching selectivity with respect to the second mask 170, e.g., preferably consists of silicon oxide or a photoresist. Then a second well 200 is formed in the strain-relaxed buffer layer 110 in the second region II, using a second ion implantation process. The second ion implantation process may implant an n-type dopant, e.g., phosphorus (Ph) or arsenic (As), into the strain-relaxed buffer layer 110. That is, the second well 200 may be an n-type well. The third mask 190 may be removed after the second ion implantation process. Furthermore, at this point in the process, the structure is subjected to a second heat treatment to cause the implanted dopant (n-type) to diffuse in the strain-relaxed buffer layer 110 in the second region II. Accordingly, the second well 200 may be formed such that its lower boundary is disposed below level of the bottom surface of the device isolation region 161.

Figure 10:
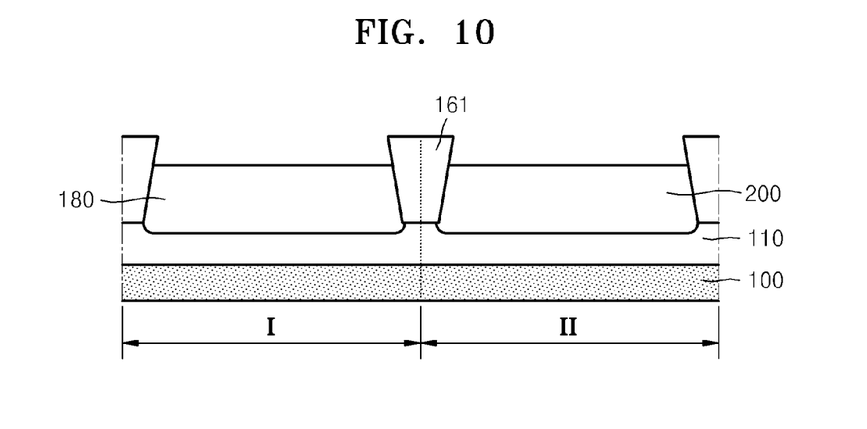

Referring to FIG. 10, the sacrificial layer pattern 121 is removed to expose the upper surface of the strain-relaxed buffer layer 110 in the first and second regions I and II. The sacrificial layer pattern 121 may be removed by a wet etching process or a dry etching process.

Figure 11:
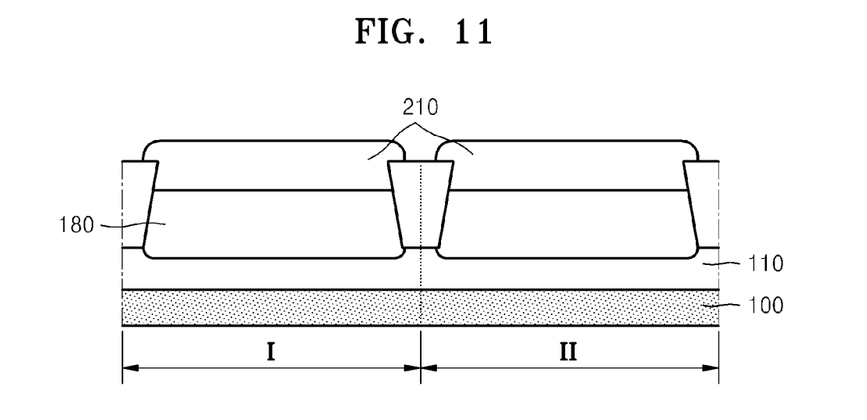

Referring to FIG. 11, a first channel layer 210 is formed on the first well 180 in the first region I and the second well 200 in the second region II. The first channel layer 210 may comprise at least one material selected from the group consisting of a compound including a semiconductor from group 3, 4 or 5, silicon germanium (SiGe), and silicon (Si). The first channel layer 210 may be formed by a selective epitaxial growth process which is not accompanied by any doping process (i.e., by any process of doping the material being grown with n-type or p-type dopants). In this case, the selective epitaxial growth process is preferably performed in a temperature range of 450-800° C. Furthermore, the first channel layer 210 is preferably formed to a thickness of 25 to 35 nm. Finally, in this respect, the first channel layer 210 may be formed until its upper surface is disposed at a level higher than that of the upper surface of the device isolation region 161.

Figure 12:
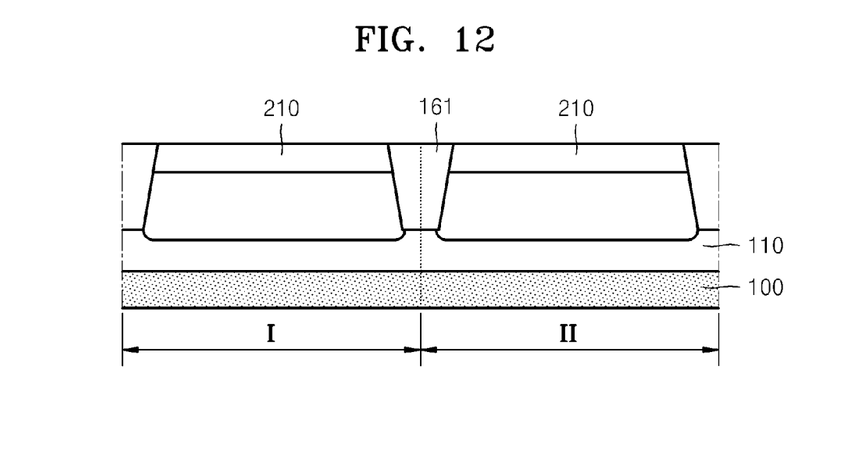

Referring to FIG. 12, in one example of this embodiment, the first channel layer 210 is planarized by a chemical mechanical polishing (CMP) process. In this respect, segments of the device isolation region 161 at opposite sides of each region I and II may be used as to stop the CMP process. That is, the device isolation region 161 may serve as a CMP etch stop layer in the CMP process. In this case, the planarized upper surface of the first channel layer 210 is disposed at substantially the same level as, i.e., coplanar with, the upper surface of the adjacent device isolation region 161. In another example of this embodiment, the CMP process is skipped at this time, and the first channel layer 210 is planarized with a second channel layer 230 (later formed as described with reference to FIG. 15).

Figure 13:
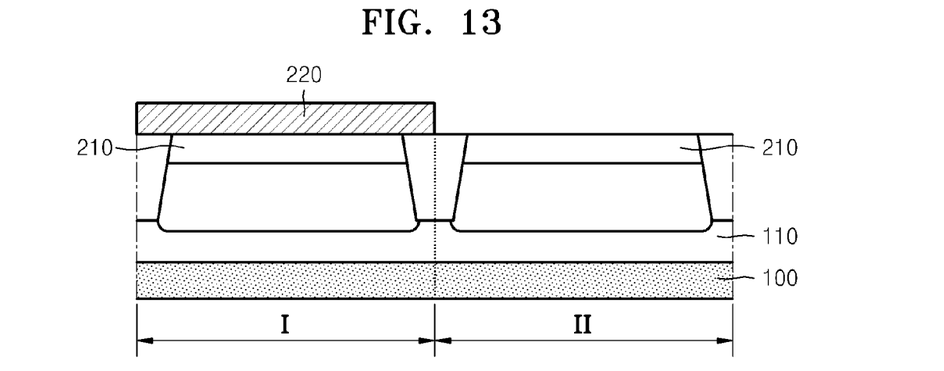

Referring to FIG. 13, a fourth mask 220 is formed to cover the first channel layer 210 in the first region I and leave the second region II exposed. The fourth mask 220 may be formed of at least one layer of material selected from the group consisting of silicon nitride, silicon oxynitride, and silicon oxide.

Figure 14:
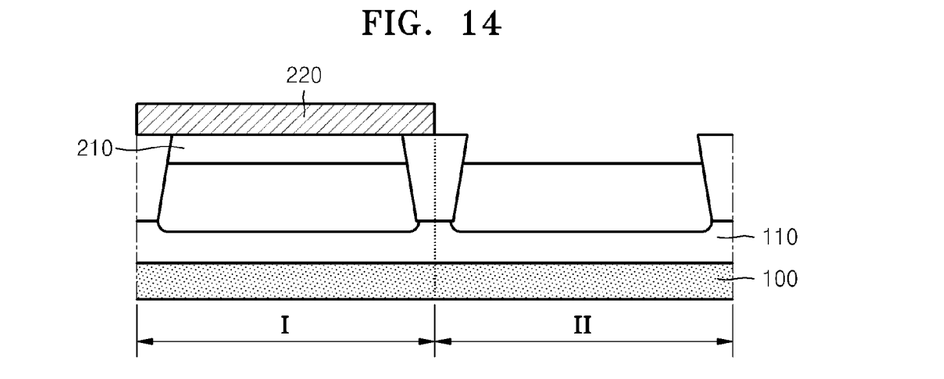

Referring to FIG. 14, the first channel layer 210 is removed from the second region II by a wet etch process or a dry etch process using the fourth mask 220 as an etching mask, thereby exposing the upper surface of the second well 200.

Figure 15:
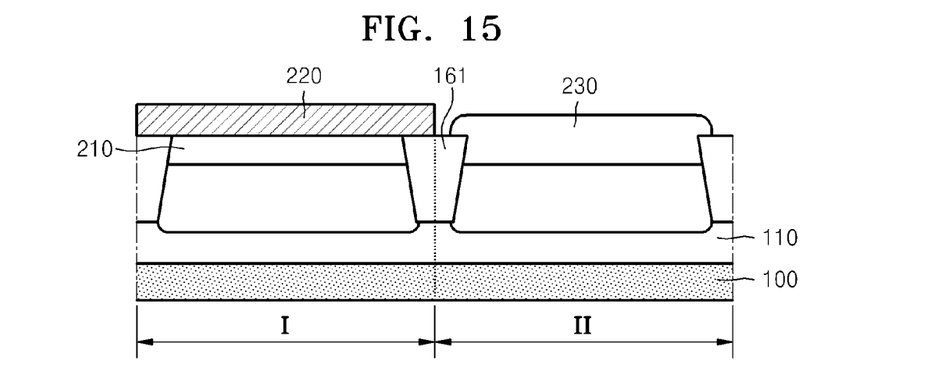

Referring to FIG. 15, a second channel layer 230 is then formed on the second well 200 by a selective epitaxial growth process. The second channel layer 230 may comprise at least one material selected from the group consisting of compounds including a semiconductor selected from group 3, 4 or 5, silicon germanium (SiGe), and germanium (Ge). The second channel layer 230 may be formed by a selective epitaxial growth process which is not accompanied by any doping process, i.e., in which the material being grown is not doped with n-type or p-type dopants. In this case, the selective epitaxial growth process is preferably performed in a temperature range of 450-800° C. Preferably, the second channel layer 230 is formed to a thickness of 25 to 35 nm. Finally, in this respect, the second channel layer 230 may be formed such that its upper surface is disposed at a level higher than that of the upper surface of the device isolation region 161.

Figure 16:
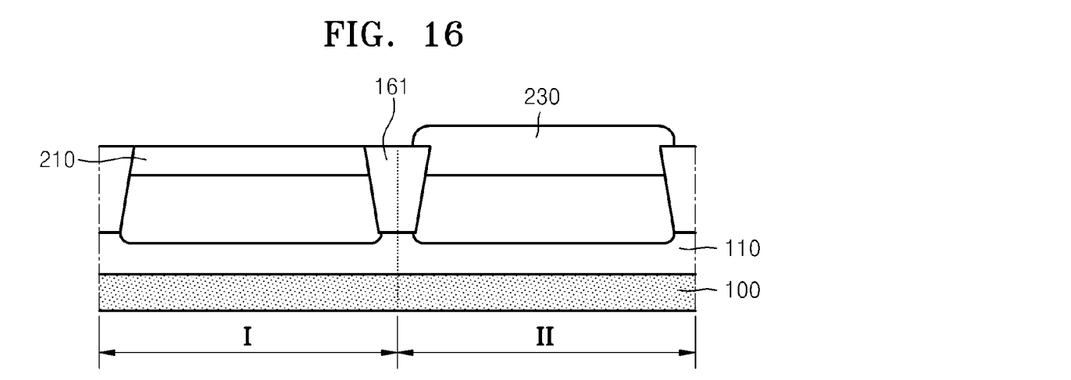

Referring to FIG. 16, the fourth mask 220 is then removed by a dry etch process or a wet etch process.

Figure 17:
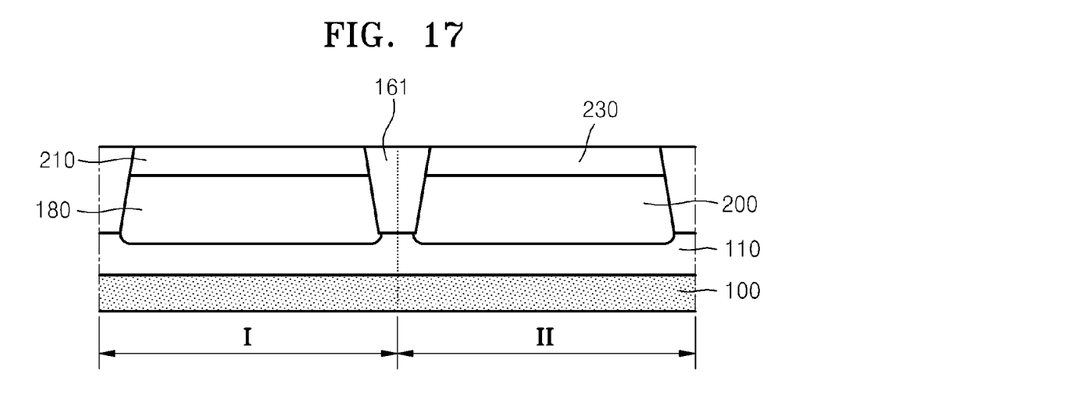

Referring to FIG. 17, the second channel layer 230 may be planarized by a chemical mechanical polishing (CMP) process. During the CMP process, the device isolation region 161 may serve as a CMP etch stop layer. In this case, the planarized upper surface of the second channel layer 230 is disposed at substantially the same level as, i.e., coplanar with, the upper surface of the device isolation region 161. Also, as was mentioned earlier, the first channel layer 210 may be planarized by the same CMP process such that its upper surface is disposed at substantially the same level as that of the upper surface of the second channel layer 230.

Next, conventional processes per se for completing transistors of the device are performed. For example, a gate dielectric layer, a gate electrode structure, and source/drain regions are formed at each of the first and second regions I and II. In addition, interconnections including contact plugs and bit lines, etc., may be formed to complete a semiconductor device according to the inventive concept.

In an example of a semiconductor device formed according to the above-described method, the first well 180 is a p-type well, and an NMOS transistor is formed in the first well 180. Furthermore, tensile stress is induced in the first channel layer 210 to increase the mobility of electrons which are the majority of charge carriers in an NMOS transistor. To this end, a lattice constant of material constituting the first channel layer 210 is lower than a lattice constant of material constituting the strain-relaxed buffer layer 110 (in a direction corresponding to the lengthwise direction of the channel of the NMOS transistor in the case in which the lattice structures are not cubic or in all directions in cases of cubic lattice structures).

Furthermore, in this example, the second well 200 is an n-type well, a PMOS transistor is formed in the second well 200, and compressive stress is induced in the second channel layer 230 to increase the mobility of holes which are the majority of charge carriers in a PMOS transistor. To this end, a lattice constant of material constituting the second channel layer 230 higher than a lattice constant of material constituting the strain-relaxed buffer layer 110 (in a direction corresponding to the lengthwise direction of the channel of the PMOS transistor in the case in which the lattice structures are not cubic or in all directions in cases of cubic lattice structures).

Referring still to FIG. 17, in one embodiment, the strain-relaxed buffer layer 110, the first channel layer 210, and the second channel layer 230 all comprise silicon germanium (SiGe) but have different lattice constants. For example, the strain-relaxed buffer layer 110 is formed of $Si_{(1-x)}Ge_x$, the first channel layer 210 comprises $Si_{(1-y)}Ge_y$, and the second channel layer 230 comprises $Si_{(1-z)}Ge_z$, wherein y is greater than x such that lattice constant of the first channel layer 210 is lower than the lattice constant of the strain-relaxed buffer layer 110, and z is greater than x such that the lattice constant of the second channel layer 230 is higher than the lattice constant of the strain-relaxed buffer layer 110. In other words, in an example of this embodiment, y and z are greater than or equal to 0 but less than or equal to 1, respectively, and x is greater than y but less than z. Accordingly, tensile stress is induced in the first channel layer 210, and compressive stress is induced in the second channel layer 230.

It was verified experimentally that the higher the tensile stress induced in the first channel layer 210 was, the fewer were the stacking faults and dislocation defects, when the difference of germanium concentration between the first channel layer 210 and the strain-relaxed buffer layer 110 is about 30%. As an example of such a case, the composition of the silicon germanium of the first channel layer 210 is $Si_{0.8}Ge_{0.2}$ and the composition of the silicon germanium of the strain-relaxed buffer layer 110 is $Si_{0.5}Ge_{0.5}$. It was also verified experimentally that the higher the compressive stress induced in the second channel layer 230 was, the fewer were the stacking faults and the dislocation defects, when the difference of germanium concentration between the second channel layer 230 and the strain-relaxed buffer layer 110 is about 30%. As an example of such a case, the composition of the silicon germanium of the second channel layer 230 is $Si_{0.2}Ge_{0.8}$ and the composition of the silicon germanium of the strain-relaxed buffer layer 110 is $Si_{0.5}Ge_{0.5}$. In other words, x minus y is in a range of 0.2-0.4 and z minus x is in a range of 0.2-0.4.

Another embodiment of a method of manufacturing a semiconductor device according to of the inventive concept will now be described with reference to FIGS. 18 through 33.

Figure 18:
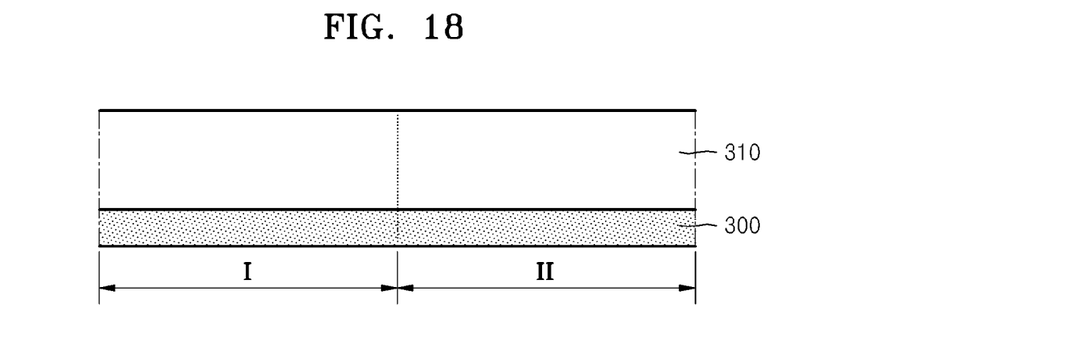

Referring first to FIG. 18, a substrate 300 is provided. The substrate 300 may be a rigid substrate, e.g., a bulk silicon substrate, a silicon-on-insulator (SOI) substrate, a germanium substrate, a silicon germanium substrate, an indium antimonide substrate, a lead telluride substrate, an indium arsenide substrate, an indium phosphorus substrate, a gallium arsenide substrate, or an antimony gallium substrate.

A strain-relaxed buffer layer 310 is formed on the substrate 300. The strain-relaxed buffer layer 310 may comprise at least one material selected from the group consisting of compounds including a semiconductor from group 3, 4 or 5, silicon germanium (SiGe), and germanium (Ge). Examples of the compounds include gallium arsenic antimonide (GaAsSb), indium gallium arsenide (InGaAs), indium antimonide (InSb), gallium antimonide (GaSb), and indium arsenide (InAs). The strain-relaxed buffer layer 310 may be formed by an epitaxial growth process which is accompanied by a doping process of introducing p-type dopants, e.g., boron fluoride (BF2) or boron (B), into the material being grown. In this case, the epitaxial growth process may be carried out in a temperature range of 450-1200° C. Also, the strain-relaxed buffer layer 310 is preferably formed to a thickness of 300 to 1000 nm.

Figure 19:
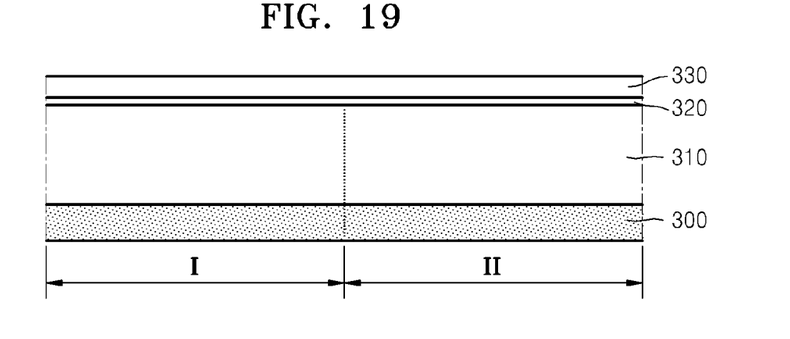

Referring to FIG. 19, a sacrificial layer 320 is formed on the strain-relaxed buffer layer 310. The sacrificial layer 320 may comprise a silicon oxide layer, having a thickness of 10 to 100 nm, formed by a thermal oxidation process or chemical vapor deposition (CVD) process.

A first mask layer(s) 330 may be formed on the sacrificial layer 320. The first mask layer(s) 330 may comprise at least one layer of material selected from the group consisting of silicon nitride (SiN) and silicon oxynitride (SiON).

Figure 20:
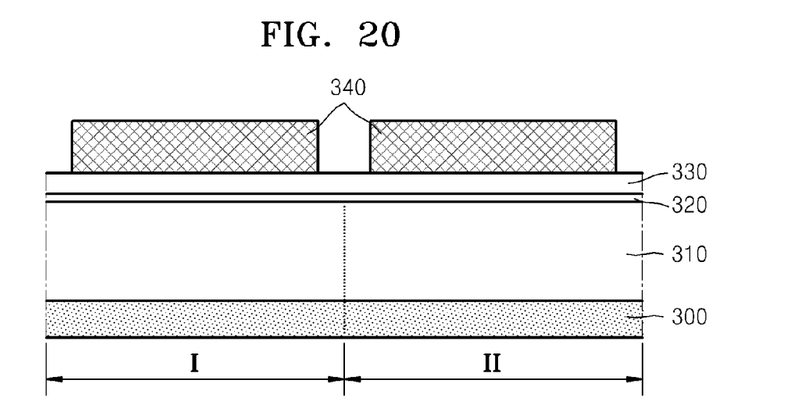

Referring to FIG. 20, a photoresist pattern 340 is formed on the first mask layer(s) 330. The photoresist pattern 340 expose a portion of the upper surface of the first mask layer(s) 330 at a boundary between a first region I and a second region II of the device.

Figure 21:
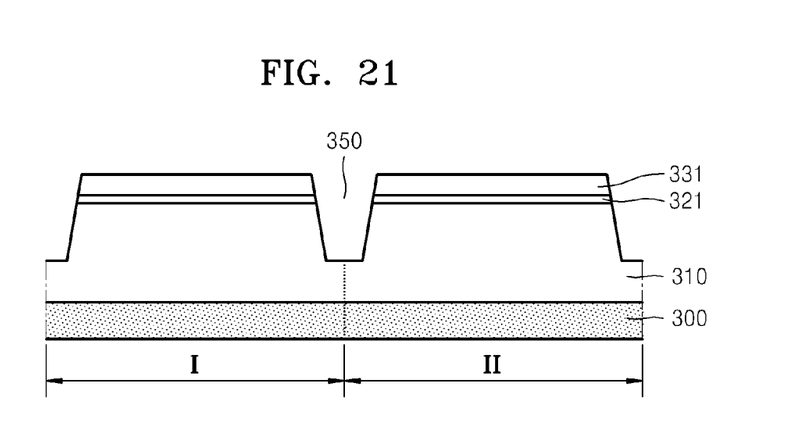

Referring to FIG. 21, a trench 350 is formed in the strain-relaxed buffer layer 310 at the boundary between the first region I and the second region II. The trench 350 may be formed by etching the first mask layer(s) 330, the sacrificial layer 320, and the strain-relaxed buffer layer 310 in a single etch process in which the photoresist pattern 340 serves as an etching mask. As a result, a first mask 331 is formed. The photoresist pattern 340 may then be removed, i.e., after the trench 350 is formed in the strain-relaxed buffer layer 310. Alternatively, the photoresist pattern 340 may be removed after the first mask 331 is formed, and the sacrificial layer 320 and the strain-relaxed buffer layer 310 are etched by a second etching process in which the first mask 331 serves as an etching mask.

Figure 22:
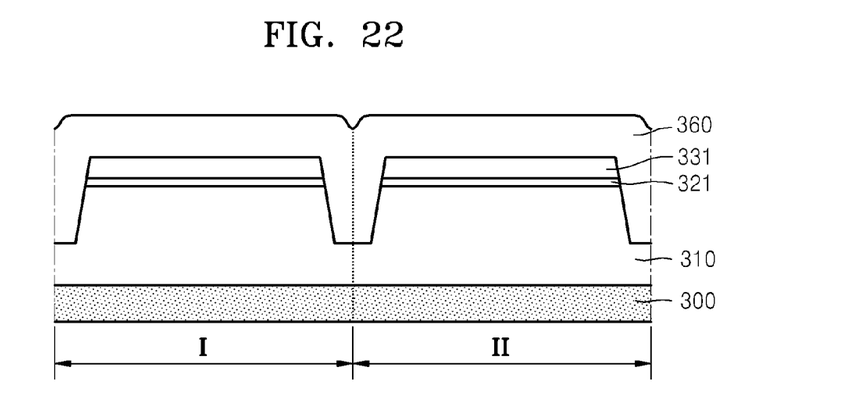

Referring to FIG. 22, a device isolation layer 360 is formed in the trench 350 and on the first mask 331. The device isolation layer 360 may comprise a silicon oxide layer formed by a high-density plasma (HDP) process or a flowable chemical vapor deposition (FCVD) process.

Figure 23:
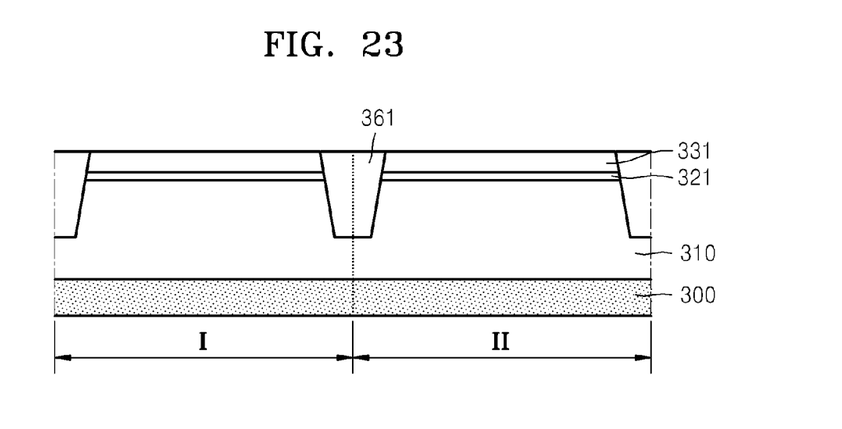

Referring to FIG. 23, a device isolation region 361 is formed at the boundary between the first region I and the second region II. The device isolation region 361 may be formed by planarizing the device isolation layer 360 until the upper surface of the first mask pattern 331 is exposed. An etch-back process or a chemical mechanical polishing (CMP) process may be used to planarize the device isolation layer 360. Furthermore, the device isolation region 361 may be formed such that its bottom surface is above the upper surface of the substrate 300.

Figure 24:
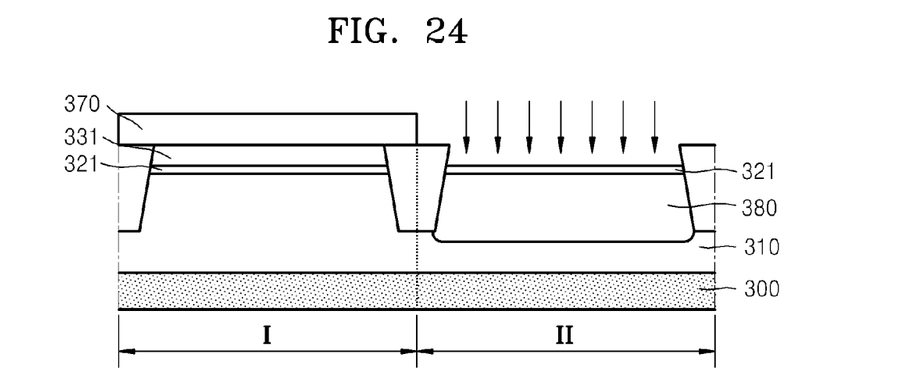

Referring to FIG. 24, a second mask 370 is formed to cover the first mask 331 in the first region I. The second mask 170 may be comprise a photoresist. The first mask 331 is then removed the second region II by a dry etch process or a wet etch process. Next, a well 380 is formed in the strain-relaxed buffer layer 310 in the second region II using a first ion implantation process. The first ion implantation process may implant an n-type dopant, e.g., phosphorus (Ph) or arsenic (As), into the strain-relaxed buffer layer 310. In this case, the well 380 is an n-type well. Furthermore, the second mask 370 and the first mask 331 are removed from the first region I after the first ion implantation process has been performed, and then the resulting structure is heat treated to cause the implanted dopants to diffuse in the strain-relaxed buffer layer 310. Accordingly, the lower boundary of the well 380 may be disposed at a level lower than the level of the bottom surface of the device isolation region 361.

Figure 25:
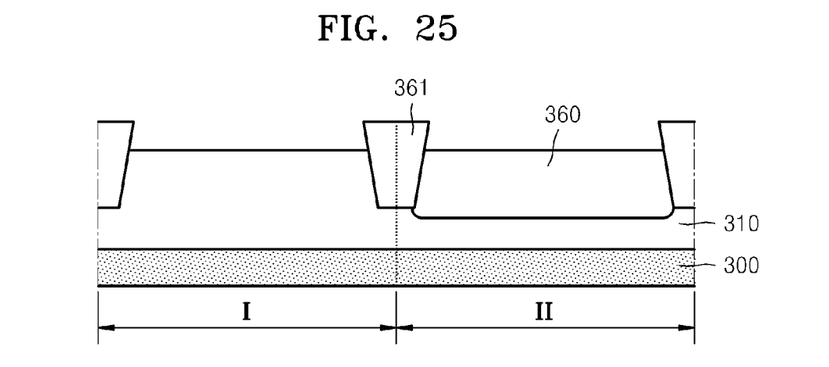

Referring to FIG. 25, the sacrificial layer 320 is removed to expose the upper surface of the strain-relaxed buffer layer 310 in the first and second regions I and II. The sacrificial layer 320 may be removed by a wet etching process or a dry etching process.

Figure 26:
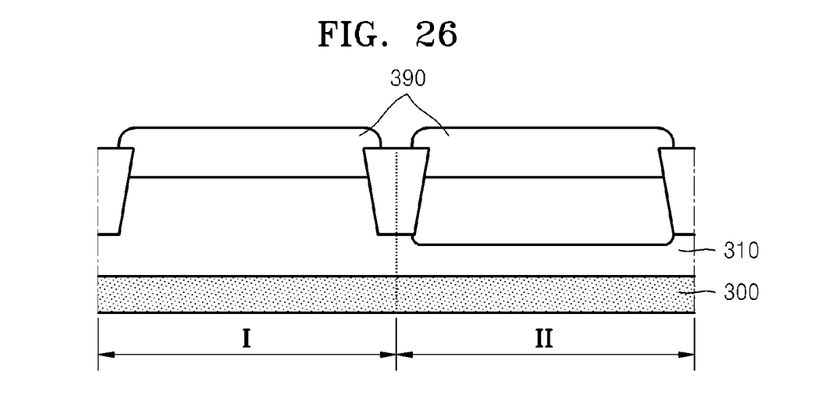

Referring to FIG. 26, a first channel layer 390 is formed on the strain-relaxed buffer layer 310 in the first region I and the well 380 in the second region II. The first channel layer 390 may comprise at least one material selected from the group consisting of compounds including a semiconductor from group 3, 4 or 5, silicon germanium (SiGe), and silicon (Si). The first channel layer 390 may be formed by a selective epitaxial growth process which is not accompanied by any doping process, i.e., in which the material being grown is not doped with n-type or p-type dopants. The selective epitaxial growth process may be performed in a temperature range of 450-800° C. Preferably, the first channel layer 390 is grown to a thickness of 25 to 35 nm. Also, using this technique, the upper surface of the first channel layer 390 may be disposed at a level above the upper surface of the device isolation region 361.

Figure 27:
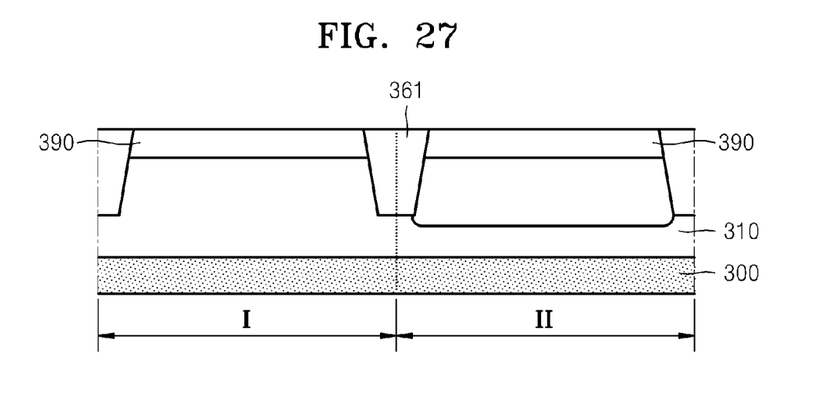

Referring to FIG. 27, the first channel layer 390 may be planarized by a chemical mechanical polishing (CMP) process. In this case, the device isolation region 361 may serve as a CMP etch stop layer. In this case, the planarized upper surface of the first channel layer 390 is disposed at substantially the same level as, i.e., coplanar with, the upper surface of the device isolation region 161. Alternatively, the CMP process may be skipped at this point in the process and the first channel layer 390 may be simultaneously planarized with a second channel layer 410 (shown in FIG. 31) formed later on in the process.

Figure 28:
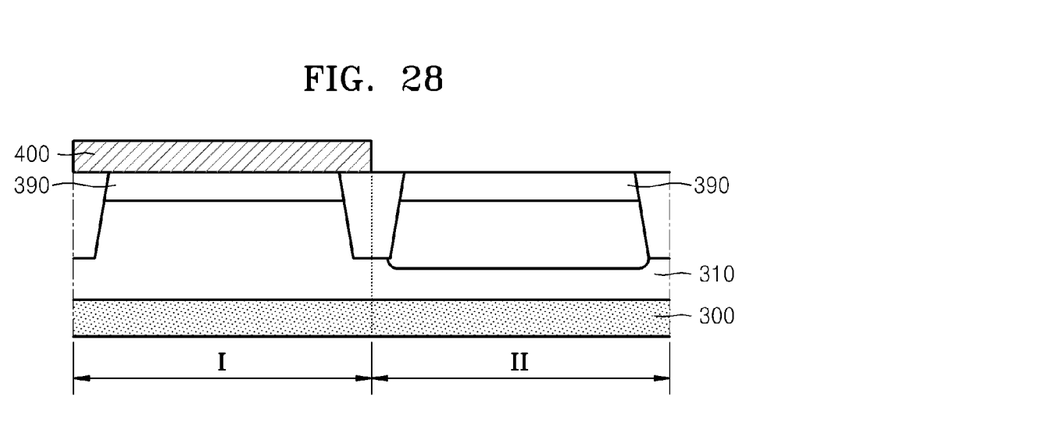

Referring to FIG. 28, a third mask 400 is formed to expose the second region II and cover the first channel layer 390 in the first region I. The third mask 400 may be formed of at least one layer of material selected from the group consisting of silicon nitride, silicon oxynitride, and silicon oxide.

Figure 29:
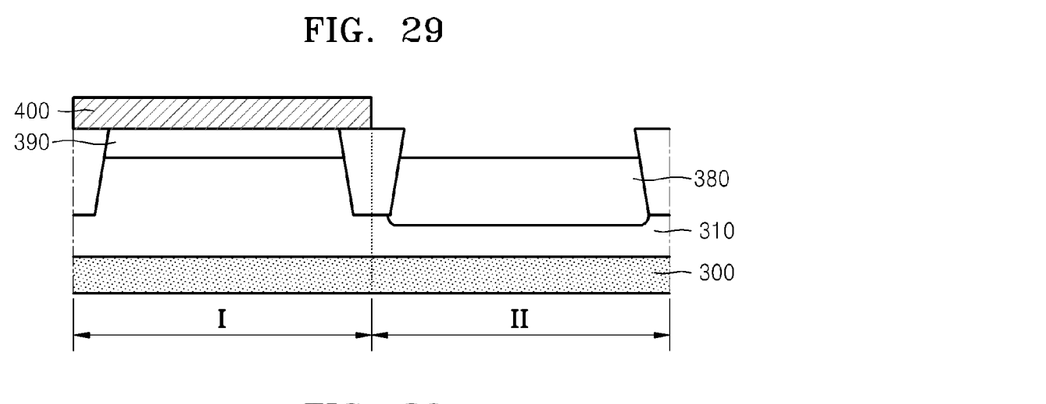

Referring to FIG. 29, the first channel layer 390 is removed from the second region II by a wet etch process or a dry etch process using the third mask 400 as an etching mask. As a result, the upper surface of the well 380 is exposed.

Figure 30:
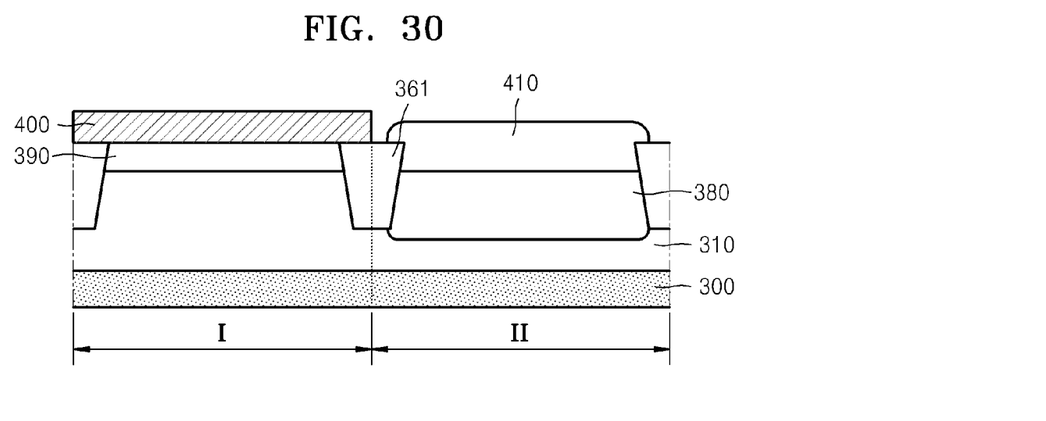

Referring to FIG. 30, a second channel layer 410 is formed on the second well 380 by a selective epitaxial growth process. The second channel layer 410 may comprise at least one material selected from the group consisting of compounds including a semiconductor from group 3, 4 or 5, silicon germanium (SiGe), and germanium (Ge). The second channel layer 410 may be formed by a selective epitaxial growth process which is not accompanied by any process of doping the material being grown with n-type or p-type dopants. The selective epitaxial growth process may be performed in a temperature range of 450-800° C. Preferably, the second channel layer 410 is formed to a thickness of 25 to 35 nm. Also, using this technique, the upper surface of the second channel layer 410 may be disposed at a level higher than that at which the upper surface of the device isolation region 361 is disposed.

Figure 31:
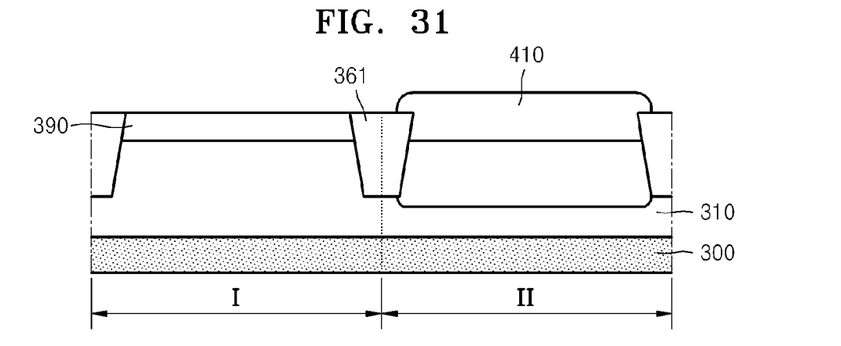

Referring to FIG. 31, the third mask 400 is removed by a dry etch process or a wet etch process.

Figure 32:
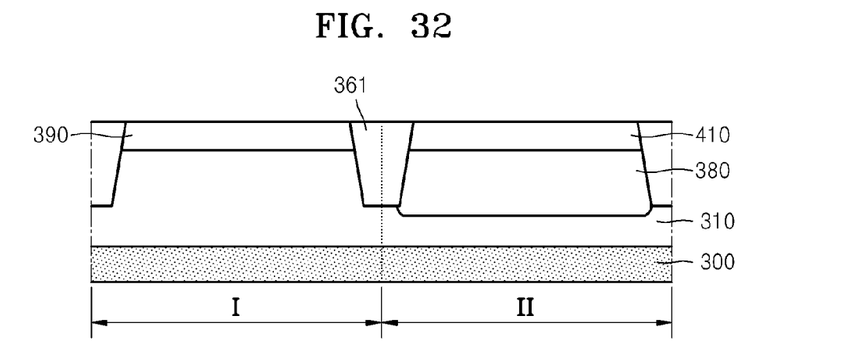

Referring to FIG. 32, the second channel layer 410 is planarized by a chemical mechanical polishing (CMP) process. Once again, in this CMP process, the device isolation region 361 may be serve as a CMP etch stop layer. As a result, the planarized upper surface of the second channel layer 410 may be disposed at substantially the same level as, i.e., coplanar with, the upper surface of the device isolation region 361. Furthermore, as was mentioned earlier, the first channel layer 390 may be planarized at this point in the process along with the second channel layer 410. In any case, the upper surfaces of the planarized first channel layer 390 second channel layer 410 may be coplanar.

Figure 33:
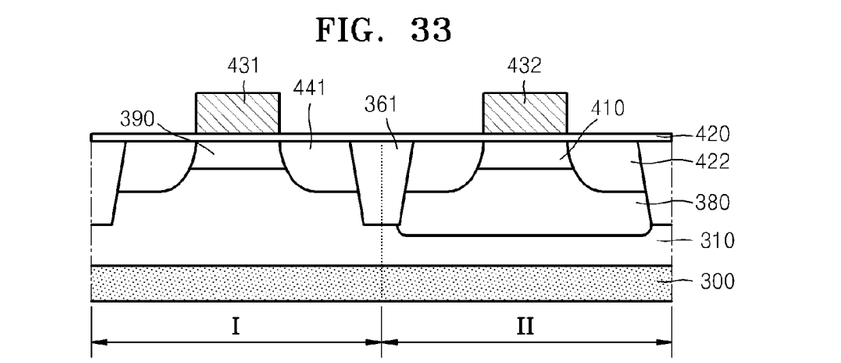
FIG. 33 is a cross-sectional view of the device itself.

Referring to FIG. 33, a gate dielectric 420 may be formed directly on the first channel layer 390 and the second channel layer 410. In this case, the gate dielectric 420 may be formed of at least one layer of material selected from the group consisting of a silicon oxide layer and a high-k dielectric layer. A first gate electrode 431 may be formed on the gate dielectric 420 in the first region I and a second gate electrode structure 432 may be formed on the gate dielectric 420 in the second region II. Still further, a first source/drain region 441 may be formed at both sides of the first gate electrode structure 431 and a second source/drain region 442 may be formed at both sides of the second gate electrode structure 432.

Next, an interlayer dielectric layer may be formed on the substrate 300 over the first and second gate electrode structures 431 and 432, and interconnections including contact plugs in the interlayer dielectric layer and bit lines, etc., may be formed to complete a semiconductor device according to the inventive concept.

In an example of this embodiment, the strain-relaxed buffer layer 310 has a p-type dopant, an NMOS transistor is formed in the strain-relaxed buffer layer 310 in the first region I, and tensile stress is induced in the first channel layer 390 to increase the mobility of electrons which are the majority of charge carriers in an NMOS transistor. To this end, a lattice constant of material constituting the first channel layer 390 is lower than a corresponding lattice constant of material constituting the strain-relaxed buffer layer 310.

Also, in this example, the well 380 is an n-type well, a PMOS transistor is formed in the well 380, and compressive stress is induced in the second channel layer 410 to increase the mobility of holes which are the majority of charge carriers in a PMOS transistor. To this end, the lattice constant of material constituting the second channel layer 410 is higher than a corresponding lattice constant of material constituting the strain-relaxed buffer layer 310.

Still further, in one embodiment, the strain-relaxed buffer layer 310, the first channel layer 390, and the second channel layer 410 are all formed of silicon germanium (SiGe) but have different lattice constants. For example, the strain-relaxed buffer layer 310 is formed of $Si_{(1-x)}Ge_x$, the first channel layer 390 comprises $Si_{(1-y)}Ge_y$, and the second channel layer 410 comprises $Si_{(1-z)}Ge_z$, wherein y is greater than x such that the lattice constant of the first channel layer 390 is lower than the lattice constant of the strain-relaxed buffer layer 310, and z is greater than x such that the lattice constant of the second channel layer 410 is higher than the lattice constant of the strain-relaxed buffer layer 310. That is, y and z are greater than or equal to 0 but less than or equal to 1, respectively, and x is greater than y but less than z. Accordingly, tensile stress is induced in the first channel layer 390 and compressive stress is induced in the second channel layer 410.

It was verified experimentally that the higher tensile stress induced in the first channel layer 390 was, the fewer were the stacking faults and the dislocation defects, when the difference of germanium concentration between the first channel layer 390 and the strain-relaxed buffer layer 310 is about 30%. As an example of such a case, the composition of the silicon germanium of the first channel layer 390 is $Si_{0.8}Ge_{0.2}$ and the composition of the silicon germanium of the strain-relaxed buffer layer 310 is $Si_{0.5}Ge_{0.5}$. It was also verified experimentally that the higher compressive stress induced in the second channel layer 410 was, the fewer were the stacking faults and the dislocation defects, when the difference of germanium concentration between the second channel layer 390 and the strain-relaxed buffer layer 310 is about 30%. As an example of such a case, the composition of the silicon germanium of the second channel layer 410 is $Si_{0.2}Ge_{0.8}$ and the composition of the silicon germanium of the strain-relaxed buffer layer 310 is $Si_{0.5}Ge_{0.5}$. In other words, x minus y is in a range of 0.2-0.4 and z minus x is also in a range of 0.2-0.4.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device, comprising:
a substrate;
a strain-relaxed buffer layer having a p-type impurity on the substrate;
a first channel layer on the strain-relaxed buffer layer and located in a first region of the device;
an n-type well in the strain-relaxed buffer layer and located in a second region of the device;
a second channel layer on an upper bound of the n-type well;
a gate dielectric disposed directly on the first and second channel layers;
a device isolation region comprising insulation material in the strain-relaxed buffer layer at a boundary between the first region and the second region; and
wherein a lattice constant of the first channel layer is less than a lattice constant of the strain-relaxed buffer layer, but a lattice constant of the second channel layer is greater than said lattice constant of the strain-relaxed buffer layer,
the bottom surface of the device isolation region is disposed above the upper surface of the substrate, and the lowermost bound of said n-type well is disposed at a level above the substrate and below the level of the bottom surface of the device isolation region.

2. The semiconductor device as claimed in claim 1, wherein the strain-relaxed buffer layer comprises at least one material selected from the group consisting of compounds including a semiconductor from group 3, 4 or 5, silicon germanium (SiGe), and germanium (Ge).

3. The semiconductor device as claimed in claim 1, wherein the first and second channel layers each have a thickness of 25 to 35 nm.

4. The semiconductor device as claimed in claim 1, wherein the strain-relaxed buffer layer comprises $Si_{(1-x)}Ge_x$, the first channel layer comprises $Si_{(1-y)}Ge_y$, and the second channel layer comprises $Si_{(1-z)}Ge_z$,
wherein y and z are greater than or equal to 0 but less than or equal to 1; and
wherein x is greater than y but less than z.

5. A semiconductor device, comprising:
a substrate;
a strain-relaxed buffer layer having a p-type impurity on the substrate;
a source and a drain of an NMOS transistor, a first channel layer disposed on the strain-relaxed buffer layer and extending in a lengthwise direction between the source and drain of the NMOS transistor, and a gate electrode of the NMOS transistor disposed on the first channel layer; and
a source and a drain of a PMOS transistor, a second channel layer disposed on the strain-relaxed buffer layer and extending in a lengthwise direction between the source and drain of the PMOS transistor, and a gate electrode of the PMOS transistor disposed on the second channel layer, and
wherein a lattice constant of the first channel layer is less than a lattice constant of the strain-relaxed buffer layer, and a lattice constant of the second channel layer is greater than said lattice constant of the strain-relaxed buffer layer, and
the source and drain of the NMOS transistor, the source and drain of the PMOS transistor, the first channel layer, and the second channel layer have upper surfaces, respectively, that are coplanar,
the semiconductor device further comprises a device isolation region comprising insulation material in the strain-relaxed buffer layer at a boundary between the NMOS transistor and the PMOS transistor, and
the strain-relaxed buffer layer has at least one well containing a dopant of a respective conductivity type, a respective one of said channel layers is disposed on each said well, the bottom surface of the device isolation region is disposed above the upper surface of the substrate, and the lowermost bound of each said well is disposed at a level below the level of the bottom surface of the device isolation region.

6. The semiconductor device as claimed in claim 5, wherein the strain-relaxed buffer layer comprises at least one material selected from the group consisting of compounds including a semiconductor from group 3, 4 or 5, silicon germanium (SiGe), and germanium (Ge).

7. The semiconductor device as claimed in claim 6, wherein the first channel layer comprises at least one material selected from the group consisting of compounds including a semiconductor from group 3, 4 or 5, silicon germanium (SiGe), and silicon (Si).

8. The semiconductor device as claimed in claim 6, wherein the second channel layer comprises at least one material selected from the group consisting of compounds including a semiconductor from group 3, 4 or 5, silicon germanium (SiGe), and germanium (Ge).

9. The semiconductor device as claimed in claim 5, wherein the strain-relaxed buffer layer comprises $Si_{(1-x)}Ge_x$, the first channel layer comprises $Si_{(1-y)}Ge_y$, and the second channel layer comprises $Si_{(1-z)}Ge_z$,
wherein y and z are greater than or equal to 0 but less than or equal to 1, respectively, and
x is greater than y but less than z.

10. The semiconductor device as claimed in claim 9, wherein x minus y is in a range of 0.2 to 0.4.

11. The semiconductor device as claimed in claim 1, wherein the strain-relaxed buffer layer comprises at least one material selected from the group consisting of gallium arsenic antimonide (GaAsSb), indium gallium arsenide (InGaAs), indium antimonide (InSb), gallium antimonide (GaSb), and indium arsenide (InAs).

12. The semiconductor device as claimed in claim 4, wherein x minus y is in a range of 0.2 to 0.4, and z-x is a range of 0.2 to 0.4.

13. The semiconductor device as claimed in claim 5, wherein the strain-relaxed buffer layer comprises at least one material selected from the group consisting of gallium arsenic antimonide (GaAsSb), indium gallium arsenide (InGaAs), indium antimonide (InSb), gallium antimonide (GaSb), and indium arsenide (InAs).

14. The semiconductor device as claimed in claim 5, wherein the strain-relaxed buffer layer has at least one well containing a dopant of a respective conductivity type,
a respective one of said channel layers is disposed on each said well, the bottom surface of the device isolation region is disposed above the upper surface of the substrate, and
the lowermost bound of each said well is disposed at a level above the substrate and below the level of the bottom surface of the device isolation region.

15. The semiconductor device as claimed in claim 10, wherein z minus x is in a range of 0.2 to 0.4.

16. The semiconductor device as claimed in claim 1, wherein the first channel layer, and the second channel layer and the device isolation layer have upper surfaces, respectively, that are coplanar.

17. The semiconductor device as claimed in claim 1, wherein the upper bound of the n-type well and the lowermost bound of the second channel region are both disposed at a level below that of the upper surface of the device isolation region.

* * * * *